United States Patent [19]
Yamada et al.

[11] Patent Number: 5,375,095
[45] Date of Patent: Dec. 20, 1994

[54] SEMICONDUCTOR MEMORY APPARATUS WITH REDUCED LINE WIDTHS

[75] Inventors: Toshio Yamada, Osaka; Michihiro Inoue, Ikoma; Junko Hasegawa, Osaka, all of Japan

[73] Assignee: Matsushita Electric Industrial Co., Ltd., Japan

[21] Appl. No.: 713,500

[22] Filed: Jun. 12, 1991

[30] Foreign Application Priority Data
Jul. 6, 1990 [JP] Japan .................. 2-179835
Jan. 28, 1991 [JP] Japan .................. 3-8713

[51] Int. Cl.$^5$ .................. G11C 8/00; G11C 7/00
[52] U.S. Cl. .................. 365/230.03; 365/230.06; 365/226; 365/189.09; 365/196; 327/51
[58] Field of Search .................. 365/230.03, 182, 205, 365/226, 530, 227, 228, 229, 189.09, 196, 208, 214, 230.06

[56] References Cited
U.S. PATENT DOCUMENTS

| | | | |
|---|---|---|---|
| 4,761,571 | 8/1988 | Golke et al. | 365/205 |
| 4,980,799 | 12/1990 | Tobita | 365/182 |
| 5,040,144 | 8/1991 | Pelley et al. | 365/226 |
| 5,072,425 | 12/1991 | Kohno et al. | 365/226 |
| 5,231,607 | 7/1993 | Yoshida et al. | 365/226 |

Primary Examiner—Timothy P. Callahan
Assistant Examiner—Trong Phan
Attorney, Agent, or Firm—Parkhurst, Wendel & Rossi

[57] ABSTRACT

A dynamic random access memory is formed with two power supply meshes extending throughout a memory array region in which are formed memory cells and sense amplifier circuits, thereby enabling sense amplifier drive circuits to be distributed throughout that memory array region, with each sense amplifier drive circuit being connected to the nearest points on the two supply meshes. A substantially improved value of read access time, or increased total memory capacity, can thereby be achieved by comparison with a DRAM in which the sense amplifier drive circuits are provided only at the periphery of a memory array region.

9 Claims, 15 Drawing Sheets

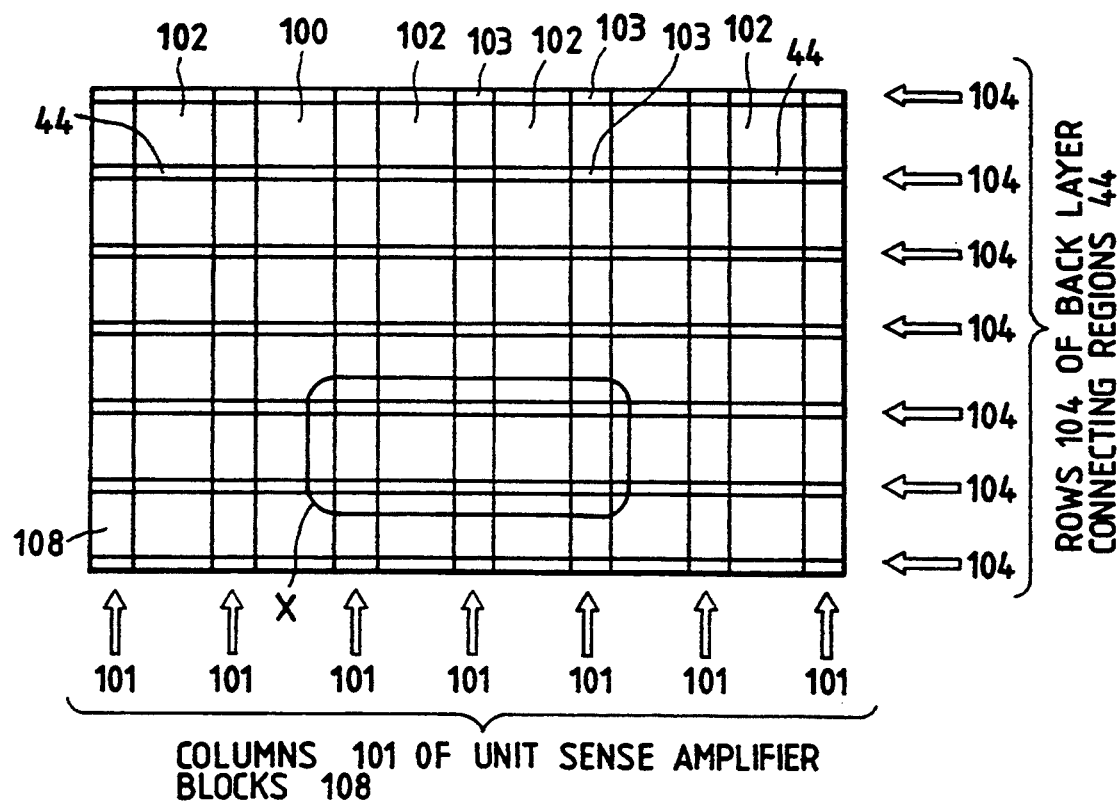

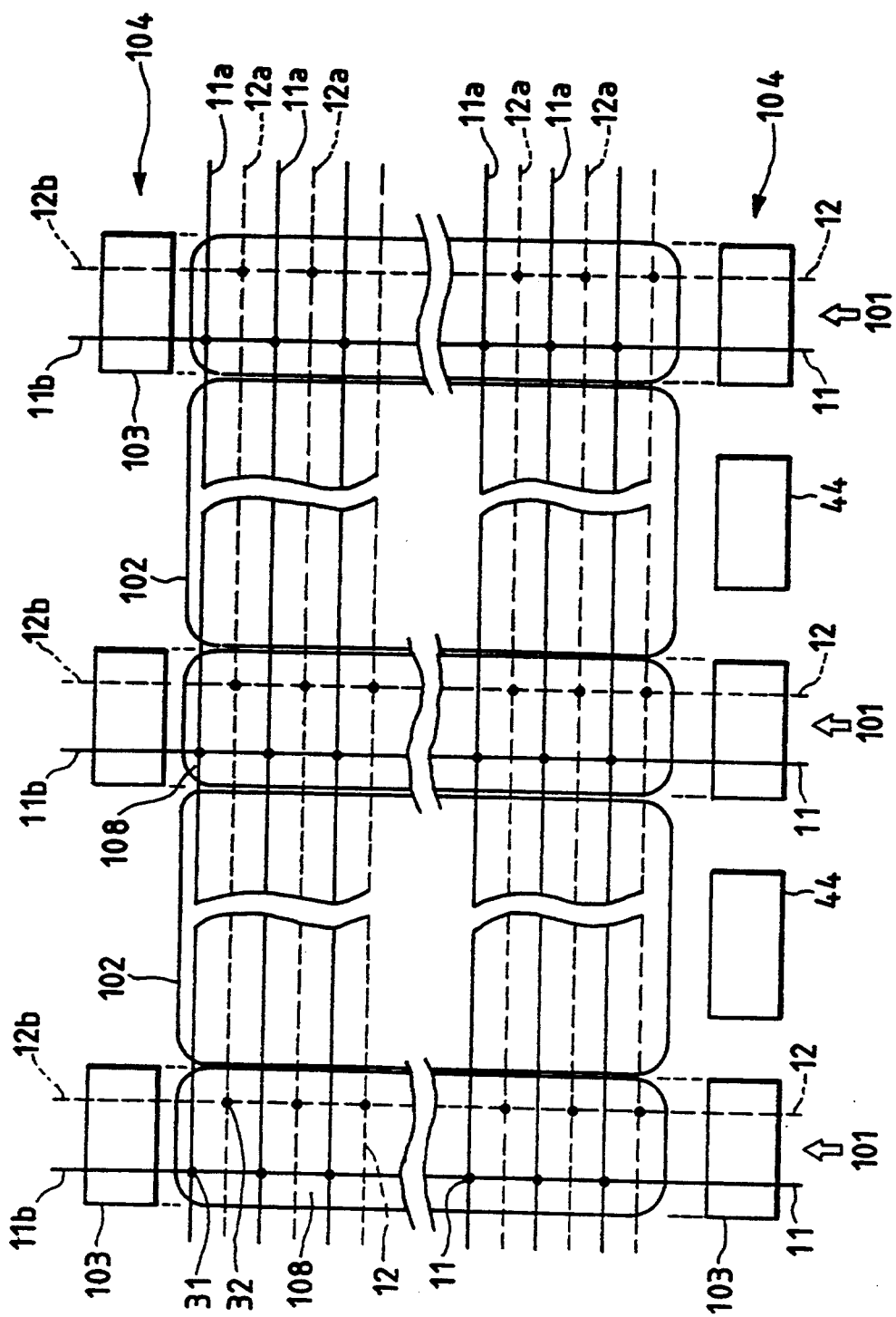

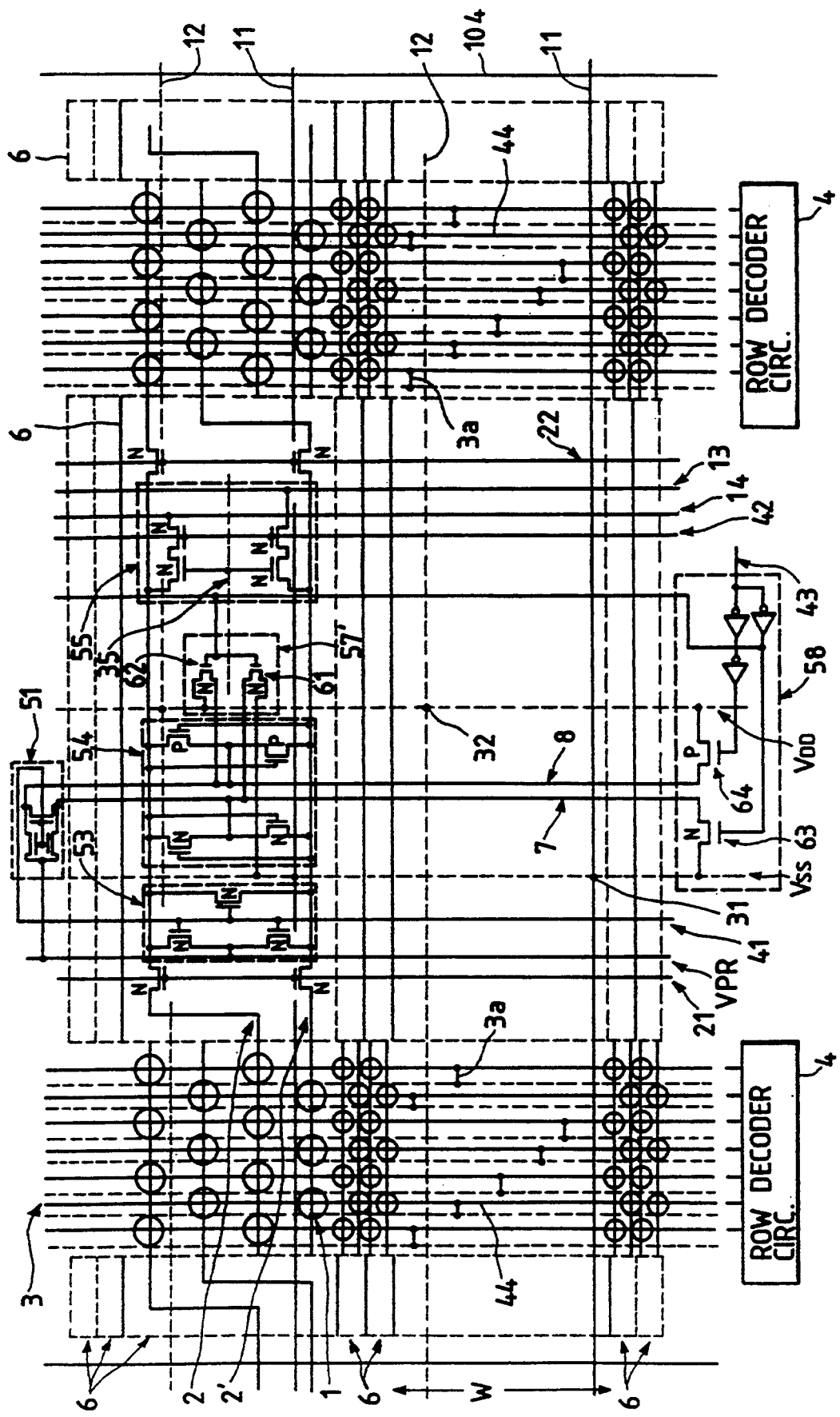

SEMICONDUCTOR MEMORY APPARATUS WITH REDUCED LINE WIDTHS

FIELD OF THE INVENTION

The present invention relates to a semiconductor memory apparatus, and in particular to an improved dynamic random access memory (hereinafter referred to as DRAM) integrated circuit wherein the adverse effects of very narrow line widths can be substantially reduced, enabling increased memory capacity or reduced read access times to be achieved.

DESCRIPTION OF THE RELATED ART

In recent years there has been a demand for DRAMs having increased levels of memory capacity and higher access speeds. These are conflicting requirements. To achieve a higher level of memory capacity, i.e. to provide a greater number of memory cells within a specific total area of a DRAM integrated circuit chip, it is necessary to reduce the widths of various connecting lines within the chip. As a result, the line resistance of these is increased, resulting in greater amounts of delay being introduced into the overall memory operation, due primarily to the time required to charge stray capacitances through these high-resistance connecting lines. The main determining factor with regard to the access time of a DRAM (as described in detail hereinafter referring to a specific circuit example) is the time required, following the initiation of a memory read operation for reading out each of respective data values stored in a set of memory cells, before the potential difference between each of the pairs of bit lines of these memory cells is amplified to a specific level by the sense amplifier circuit of the bit line pair. The basic cause of delay in that amplification by the sense amplifier circuits is the time required to charge the bit line pair capacitance, through pairs of sense amplifier drive lines (each coupled in common to a large number of sense amplifier circuits) that are peripherally connected to power supply voltages after a data read operation is initiated. The rate of charging of the bit line pair capacitance of a sense amplifier circuit depends upon the position of the sense amplifier circuit along such a pair of sense amplifier drive lines, i.e. a sense amplifier circuit that is located close to the switches that connect the bit line pair to the power supply voltages will exhibit a relatively low amount of amplification delay, whereas a sense amplifier circuit that is located substantially distant from these switches will exhibit a substantial amount of amplification delay. That delay will be increased in accordance with any reduction of the drive line widths, due to increased line resistance.

Thus, the problem of supplying sufficiently high levels of drive current to all of the sense amplifier circuits of a DRAM during a memory read operation, to ensure a sufficiently low value of read access time, has been the main obstacle in the prior art to achieving even higher degrees of integration, to obtain increased memory capacity.

SUMMARY OF THE INVENTION

It is an objective of the present invention to overcome the disadvantages of the prior art as set out above, by providing a dynamic random access memory formed as an integrated circuit chip, wherein narrower values of connecting line width can be utilized within the chip than have been utilized hitherto, while achieving values of read access time that are similar to or lower than than those of the prior art. The present invention therefore can provide a higher degree of component density, and hence higher memory capacity, without lowering the speed of operation.

These objectives are achieved, basically, by providing a pair of voltage supply meshes, i.e. electrically conducting grids, which extend throughout a region of a DRAM integrated circuit containing memory cells and associated sense amplifiers, with sense amplifier drive circuits being distributed throughout that region, supplied from adjacent points on the nets.

More specifically, the present invention provides a semiconductor memory apparatus including a memory array region having formed therein:

a plurality of unit memory cell blocks distributed through said memory array region at regular spacings, each formed of an array of memory cells;

a plurality of unit sense amplifier blocks distributed among said unit memory cell blocks at regular spacings, each formed of an array of sense amplifier circuits;

a plurality of sense amplifier drive circuits for driving said sense amplifier circuits, distributed among said unit sense amplifier blocks at regular spacings; and first and second voltage supply meshes, mutually electrically isolated and each extending throughout said memory array region, respectively coupled to receive first and second supply voltages;

each of said sense amplifier drive circuits being coupled to an adjacent point on said first voltage supply mesh to receive said first supply voltage and to an adjacent point on said second voltage supply mesh to receive said second supply voltage.

Each of said said first and second voltage supply meshes is preferably formed of a plurality of first supply lines extending in a first direction and formed in an upper layer of a substrate of said semiconductor memory apparatus and a plurality of second supply lines extending in a second direction and formed in a lower layer of said substrate which is electrically isolated from said upper layer, and a plurality of through-hole connections for interconnecting said first and second supply lines at points of intersection thereof.

Furthermore, each of said first and second supply lines of said first voltage supply mesh is preferably connected to said first supply voltage by at least one end thereof, and each of said first and second supply lines of said second voltage supply mesh is preferably connected to said second supply voltage by at least one end thereof.

BRIEF DESCRIPTION OF THE DRAWINGS

FIGS. 7A-7B, 8 and 9 are partial circuit diagrams showing details of second, third and fourth embodiments of the present invention, respectively.

DESCRIPTION OF PREFERRED EMBODIMENTS

For a better understanding of the preferred embodiments, an example of a prior art semiconductor memory apparatus will first be described, for comparison of the prior art with the semiconductor memory apparatus of the present invention.

Figure 1A:
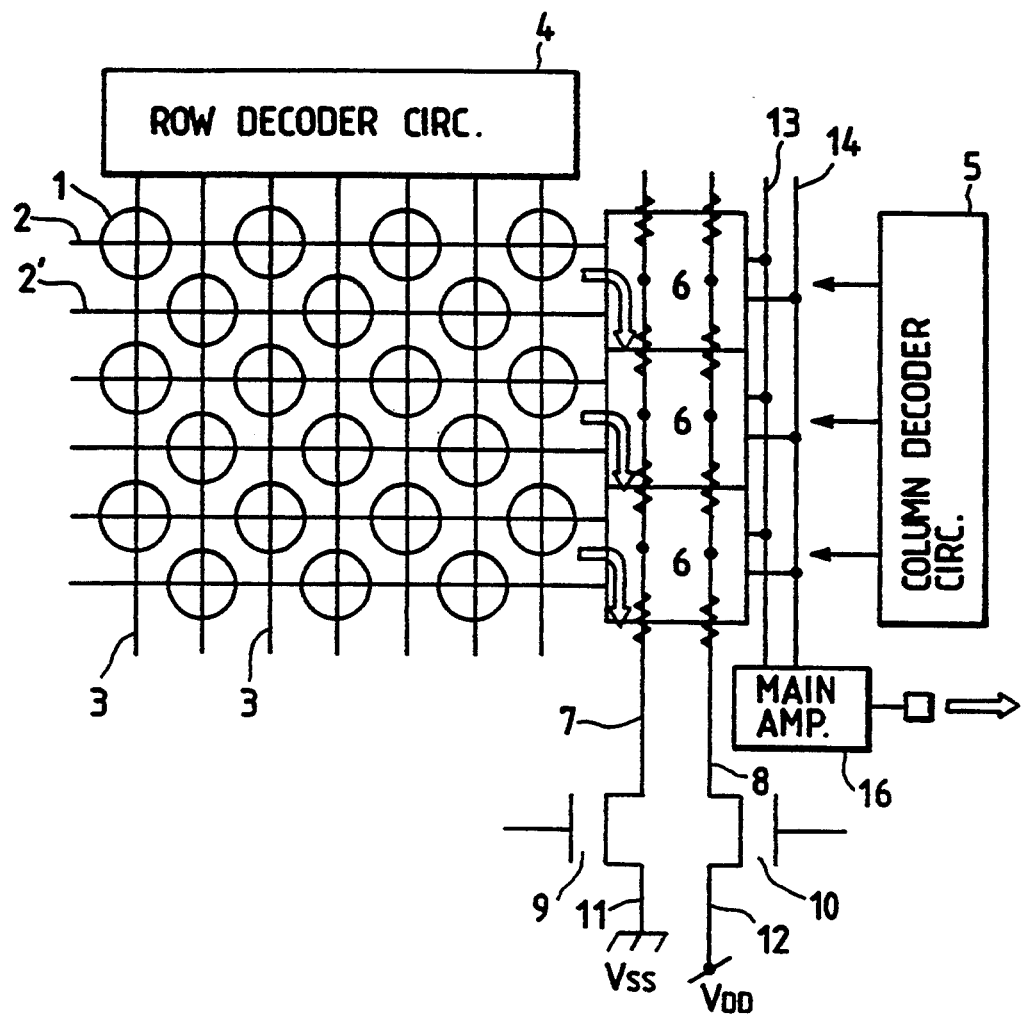
FIG. 1A is a circuit block diagram for describing the basic features of a prior art semiconductor memory apparatus.

FIG. 1A is a simplified circuit diagram for describing the basic configuration of a prior art DRAM, which will be assumed to be formed as an integrated circuit based on n-channel and p-channel MOS transistors (metal-oxide silicon field-effect transistors) used as switching-elements and amplifier elements. In FIG. 1A the numerals 1 denote respective memory cells, each for storing one data bit, and 2 and 2' denote a pair of bit lines each coupled to a row of the memory cells 1, for transferring output signals produced from memory cells 1 (i.e. outputted from a memory cell in accordance with an amount and polarity of electrical charge that has been previously stored in the cell to represent a data bit). Numerals 3 denote respective word lines, each coupled to a column of the memory cells 1, for selecting specific ones of the memory cells 1 for read/write operations, and 4 denotes a row decoder circuit for producing row selection signals to select a specific one of the word lines 3. The numerals 6 denote respective sense amplifier circuits, each of which is coupled to receive output signals transferred from memory cells 1 via a corresponding pair of bit lines 2, 2', for amplifying minute amounts of potential difference that are thereby produced between such a corresponding bit line pair when a memory cell is read. Numeral 5 denotes a column decoder circuit, for selecting an amplified output data signal of one of the sense amplifier circuits 6. As described hereinafter, each of the sense amplifier circuits 6 in such a DRAM is based upon an n-channel flip-flop (i.e. a flip-flop circuit formed of n-channel MOS transistors) and a p-channel flip-flop, with these flip-flops being connected between the corresponding bit line pair 2, 2' during a memory read operation, and with the flip-flops being respectively triggered in accordance with the polarity of the minute potential difference that is developed between that bit line pair during a memory read operation, to thereby amplify that potential difference. Numeral 7 denotes a sense amplifier n-channel flip-flop drive line, which is connected in common to the n-channel flip-flops of each of the sense amplifier circuits 6, for driving the source electrodes of these flip-flops (from an initial precharge potential, described hereinafter) towards the $V_{SS}$ power supply potential during a memory read operation. In the this embodiment, the $V_{SS}$ power supply potential is at ground potential. Numeral 9 denotes an MOS transistor which functions as a sense amplifier n-channel flip-flop (FF) drive switching transistor, which is controlled to connect the lower end of the sense amplifier n-channel FF drive line 7 to the $V_{SS}$ potential during a memory read operation. Numeral 8 denotes a sense amplifier p-channel FF drive line, which is connected in common to the p-channel flip-flops of each of the sense amplifier circuits 6, for driving the source electrodes of these flip-flops towards the $V_{DD}$ power supply potential during a memory read operation. Numeral 10 denotes an MOS transistor which functions as a sense amplifier p-channel FF drive switching transistor, which is controlled to connect the lower end of the sense amplifier p-channel FF drive line 8 to the $V_{DD}$ potential during a memory read operation. Numeral 11 denotes a ground line, for connecting the sense amplifier n-channel FF drive transistor 9 to the Vss potential, and 12 denotes a power supply line for connecting the the sense amplifier p-channel FF drive transistor 10 to the $V_{DD}$ power supply potential. 13 and 14 denote data lines, for outputting data produced from the sense amplifier circuits 6. Numeral 16 denotes a main amplifier, coupled to receive data which are transferred via the data lines 13 and 14.

Figure 1B:
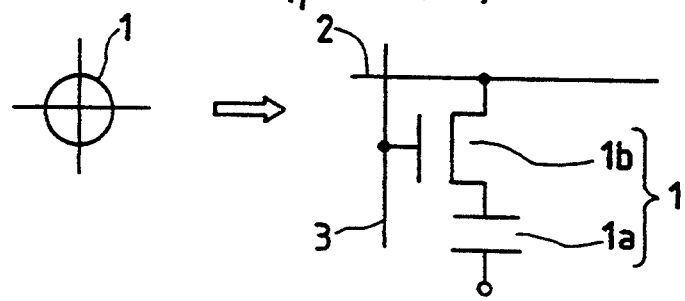
FIG. 1B shows the internal configuration of a memory cell for such a semiconductor memory apparatus.

FIG. 1B shows a specific circuit configuration for each of the memory cells 1, in which 1a denotes a capacitor for storing electrical charge representing a data bit, and 1b denotes a MOS transistor which is controlled by the selection signal applied to the corresponding word line 3, for transferring charge between the capacitor 1a and the corresponding bit line 2, for reading and writing data to/from the memory cell.

Figure 2:
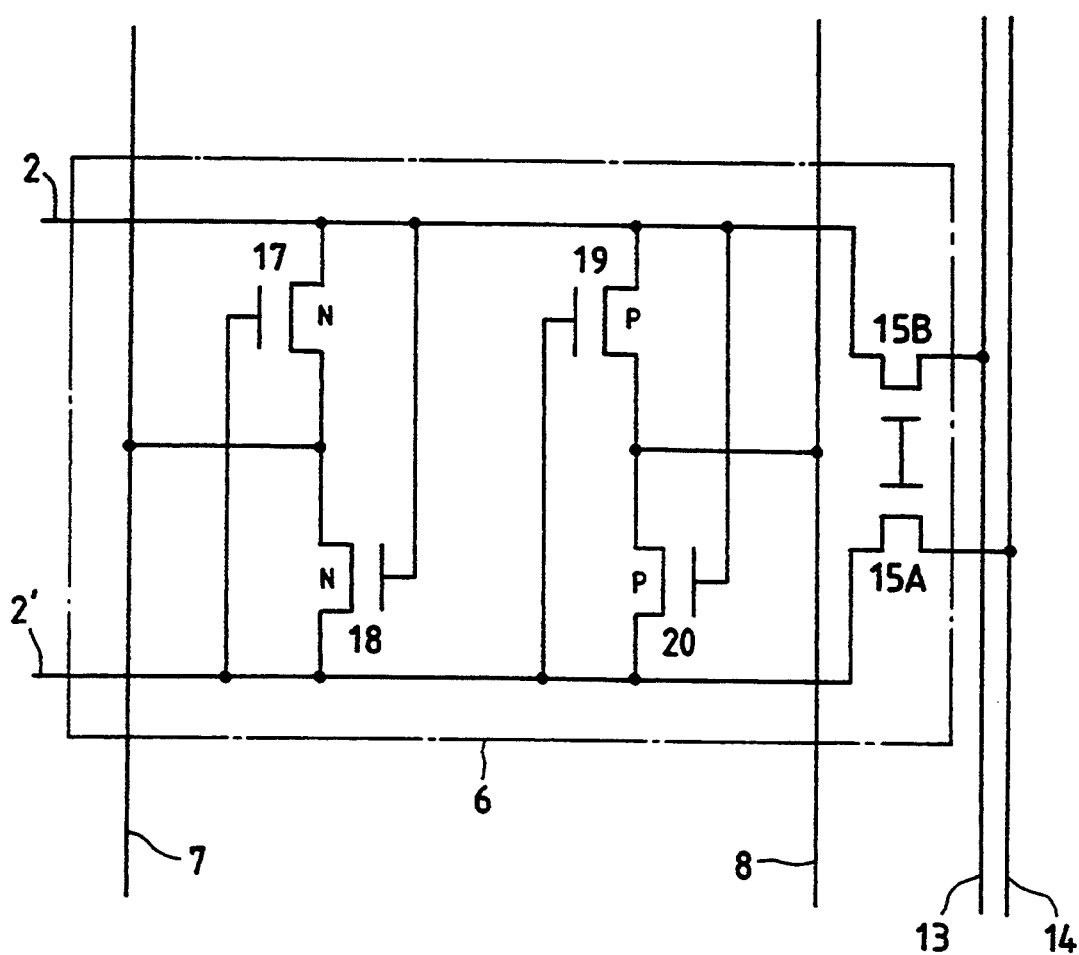
FIG. 2 is a circuit diagram of a sense amplifier circuit of a prior art semiconductor memory apparatus.

FIG. 2 shows an example of a circuit for each sense amplifier circuit 6. In FIG. 2, numerals 17, 18 denote n-channel MOS transistors, 19, 20 denote p-channel MOS transistors, which are interconnected to form the aforementioned n-channel and p-channel FFs of the sense amplifier circuit, while 15a and 15b denote respective MOS transistors serving as switches for selectively connecting the bit line pair 2, 2' to the data lines 13 and 14.

The operation of this prior art sense amplifier circuit in a memory read sequence is as follows, considering only one of the bit line pairs. Firstly, one of the word lines 3 is selected by the row decoder circuit 4. As a result, data (as electrical charge) from the memory cell 1 which is connected to that word line 3 will be outputted, e.g. to the bit line 2. A minute potential difference will thereby be generated between the bit lines 2, 2', which will be amplified by the sense amplifier circuit 6. The amplified data value is transferred through the switch transistors 15a, 15b and the data lines 13, 14, to be amplified by the main amplifier 16, then outputted from the memory chip. The operating waveforms areas shown in FIG. 3, in which a time interval A denotes a precharge interval, in which the bit lines 2, 2' are charged to a fixed potential. During the succeeding time interval B, the selected word line 3 is driven, so that the charge stored in a memory cell 1 is transferred as a signal to the bit line 2, i.e. is read out as a minute potential difference appearing between the bit lines 2, 2'. In the succeeding time interval C, the sense amplifier circuit 6 amplifies that potential difference, then the data that was read out from the memory cell 1 is rewritten back into the cell. In the succeeding time interval D, in preparation for the next read cycle, all of the bit lines 2, 2' are again charged to the fixed precharge potential, i.e. this is again a precharge interval.

Figure 3:
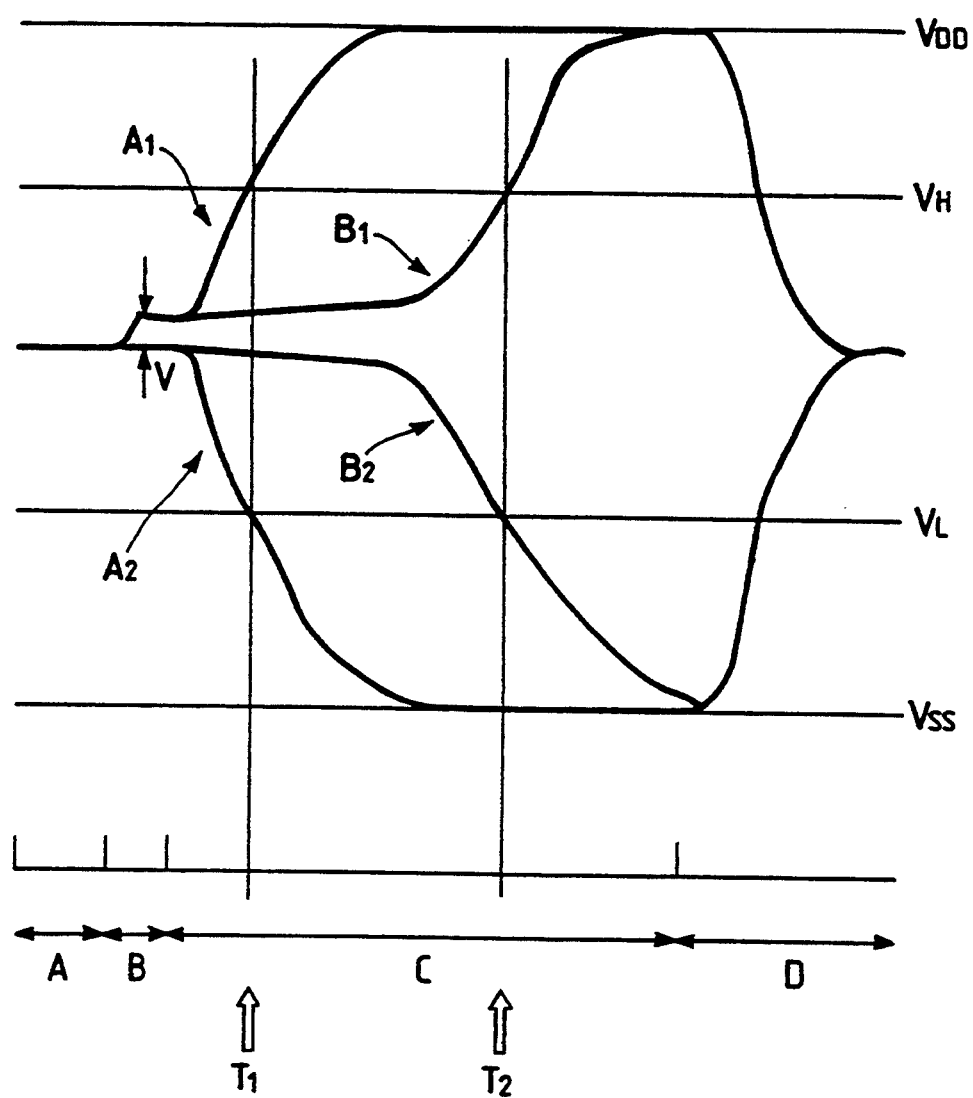
FIG. 3 is a waveform diagram for describing the operation of the semiconductor memory apparatus of FIG. 1A.

In FIG. 3, the full-line portions A1, A2 denote the voltage waveforms that would appear on the bit lines 2, 2' respectively, in an ideal condition in which the line resistance of each of the sense amplifier n-channel FF drive line 7 and sense amplifier p-channel FF drive line 8 is negligible. However in a practical memory circuit, these line resistance values cannot be ignored, and as a result, the voltage waveforms that will actually be developed on the bit lines 2, 2' (in the case of a bit line pair that is located substantially distant from the sense amplifier n-channel FF drive transistor 9 and p-channel FF drive transistor 10) will be of the form shown by the chain-line waveforms B1 and B2 respectively. The reasons for this are as follows. As shown in FIG. 2, the sense amplifier n-channel FF drive line 7 is connected to the point of connection of the source electrodes of the p-channel MOS transistors 17, 18 in a sense amplifier circuit, and in fact is similarly connected in common to each of a large number of sense amplifier circuits. When amplification of the bit line pair potential difference begins during a read cycle, one of the n-channel transistors 17, 18 in FIG. 2 will begin to enter the conducting state, thereby connecting the capacitance of the corresponding one of the bit lines 2, 2' to the sense amplifier n-channel FF drive line 7. Thus although the sense amplifier n-channel FF drive line 7 is now connected at one end to the $V_{SS}$ potential by the sense amplifier n-channel FF drive transistor 9, due to the line resistance of the sense amplifier n-channel FF drive line 7, the potential of that corresponding bit line will begin to fall only gradually towards the $V_{SS}$ potential. A similar effect will occur due to the resistance of the sense amplifier p-channel FF drive line 8, so that the potential of the other one of the pair of bit lines 2, 2' will only gradually begin to rise to the $V_{DD}$ level. Thus the rate of amplification of the potential difference between the bit line pair will bellow, and will be determined by the line resistance values of the sense amplifier n-channel FF drive line 7 and sense amplifier p-channel FF drive line 8, and by the total capacitance of each bit line 2, 2'. The main amplifier 16 is configured such that a data value read out from a memory cell 1 can only be accurately outputted (as a '1' or '0' bit) from the main amplifier 16 when each of the bit line voltage levels has reached a certain threshold value, these being designated as $V_H$ and $V_L$ in FIG. 3. The maximum value of time interval from the start of a read cycle until that condition is reached (i.e. until the actual "worst-case" time point designated as T2 in FIG. 2, rather than the ideal time point designated as T1) is the sense amplification delay time, and determines the read access time of the semiconductor memory apparatus. Thus greatest amount of sense amplification delay time will occur for the sense amplifier circuit that is located farthest from the sense amplifier n-channel FF drive transistor 9 and sense amplifier p-channel FF drive transistor 10, along the sense amplifier n-channel FF drive line 7 and sense amplifier p-channel FF drive line 8 respectively, since in that case there will be maximum values of line resistance through which current must be transferred for driving the bit line potentials to the $V_H$ and $V_L$ levels, so that the bit line waveforms will be of the form of B1 and B2. In the case of a sense amplifier circuit that is located close to the sense amplifier n-channel FF drive transistor 9 and p-channel FF drive transistor 10, since the line resistance values of the sense amplifier n-channel FF drive line 7 and sense amplifier p-channel FF drive line 8 will be relatively small, the bit line waveforms during a read cycle will be close to the ideal waveforms A1 and A2 in FIG. 3.

Since the overall read access time of a semiconductor memory apparatus is determined by the "worst-case" access time, it can be understood that the overall access time will be increased in accordance with any increase in the line resistance of the sense amplifier n-channel FF drive line 7 and sense amplifier p-channel FF drive line 8.

Figure 4:
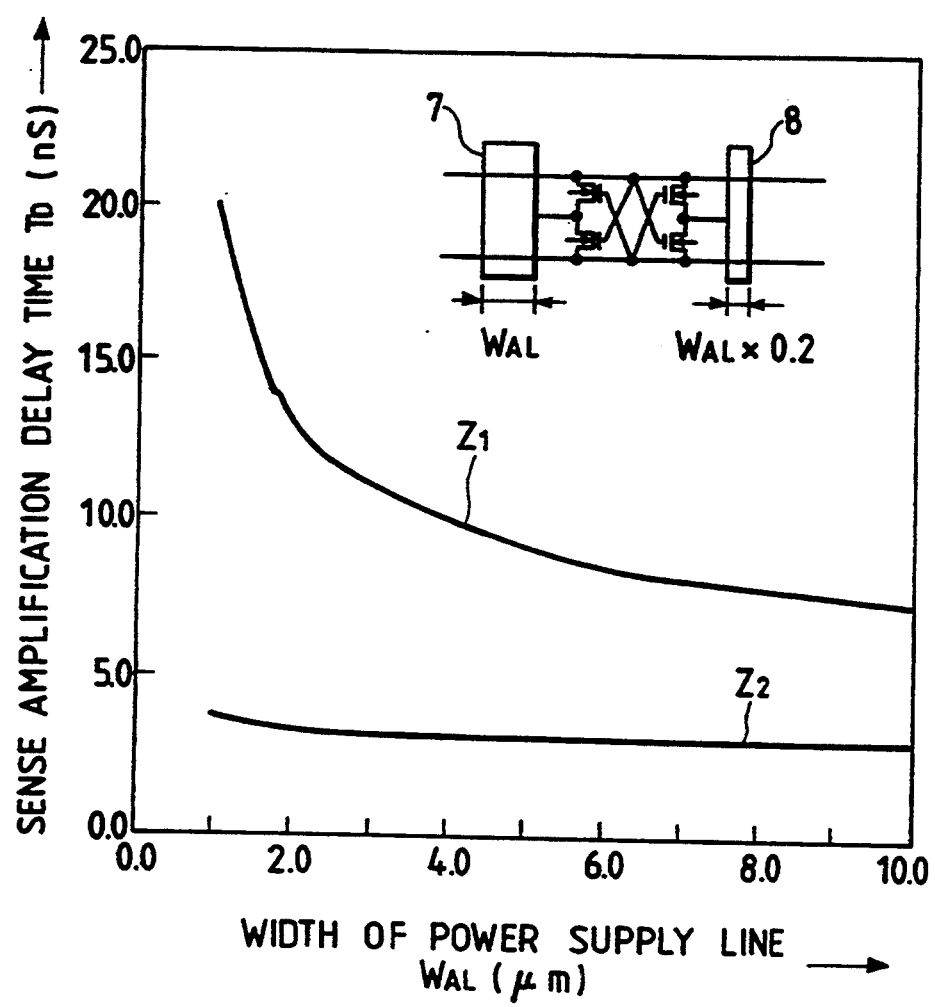
FIG. 4 is a graph for comparison of a relationship between sense amplifier circuit supply line width and sense amplification delay time, for the prior art example of FIG. 1A and an embodiment of the present invention.

A computer simulation was executed of the read operation of such a prior art DRAM, assuming that to be a 64 Mbit memory, using the SPICE circuit simulator. A relationship was thereby derived between the widths of each sense amplifier n-channel FF drive line 7 and sense amplifier p-channel FF drive line 8 and the sense amplification delay time $T_D$, designating the width of each sense amplifier n-channel FF drive line 7 as $W_{AL}$ and assuming that the width of each sense amplifier p-channel FF drive line 8 is equal to $W_{AL} \times 0.2$, and also assuming that these lines are formed of aluminum with a thickness of 0.8 μm. The result is plotted as the curve Z1 in FIG. 4. As can be seen from that curve Z1, as the width value $W_{AL}$ is reduced, the sense amplification delay time $T_D$ suddenly begins to increase sharply, after a delay time of approximately 8 ns has been exceeded. It can thus be understood that with such a prior art DRAM, not only is the sense amplification delay time inherently excessively long, but also, if the widths of the supply lines 7 and 8 are made smaller, in order to achieve a higher degree of integration of the DRAM for thereby obtaining increased memory capacity, then the value of the sense amplification delay time will rapidly become extremely high. Thus this has presented a considerable obstacle to achieving both an increased degree of component density and a higher speed of operation for a DRAM, in the prior art.

FIG. 5A is a diagram for describing the basic configuration of a first embodiment of a semiconductor memory apparatus according to the present invention, while FIG. 5B shows details of the interior of an outlined region designated as X in FIG. 5A. In the prior art example of FIG. 1A described hereinabove, each of the word lines 3 is shown as a single conductor. However it is now usual practice in the art to configure each of the word lines 3 as a pair of connecting lines that are disposed mutually adjacent in parallel and separated by a layer of electrically insulating material, for example a lower line formed of polysilicon, in a lower circuit layer in which are formed the transistors and capacitors etc. of the memory, and an upper line, formed of aluminum, which is disposed in a "back layer" above that lower circuit layer. Such an arrangement can provide lower values of line resistance for the word lines, enabling more rapid rise and fall times of potential on the word lines. However to achieve that lowered resistance it is necessary to interconnect each upper line to its corresponding lower line, by through-hole connections, at periodic spacings from the top to bottom of the word line. It is therefore necessary to provide regions in which such through-hole connections are formed, which are outside the regions in which memory cells are formed. Such regions will be referred to in the following as back layer connecting regions. In FIG. 5a, 100 denotes a memory array region in which are formed arrays of memory cells and sense amplifier circuits, in a DRAM integrated circuit chip. Numerals 102 denote respective unit memory cell blocks, each consisting of an array of a fixed number of memory cells. As shown, these unit memory cell blocks 102 are formed as successive columns, each column containing a plurality of unit memory cell blocks disposed at regular spacings. Numerals 108 denote respective unit sense amplifier blocks, each formed of a plurality of sense amplifier circuits and disposed between two adjacent unit memory cell blocks 102, along the horizontal direction of the drawings. Numerals 104 denote horizontally elongated regions each containing a row of back layer connecting regions 44, formed between vertically adjacent unit memory cell blocks 102. Numerals 101 denote respective columns of blocks of sense amplifier circuits. Numerals 103 denote respective regions of intersection between the columns of sense amplifier blocks 101 and the row region 104 of back layer connecting regions 44. Respective sense amplifier drive circuits are formed in these regions 103, i.e. with each region 103 being disposed between two adjacent back layer connecting regions.

It can thus be understood from FIGS. 5A and 5B that with the present invention, sense amplifier drive circuits are distributed throughout the memory array region, rather than being disposed only at the periphery of that region as in the prior art. It can further be understood that in this embodiment of the invention, each of the unit memory cell blocks 102 has one of these sense amplifier drive circuits respectively disposed at each of the four corners of that unit memory cell block. Typically, each unit sense amplifier block will contain a total of 64 sense amplifier circuits.

Figure 5C:
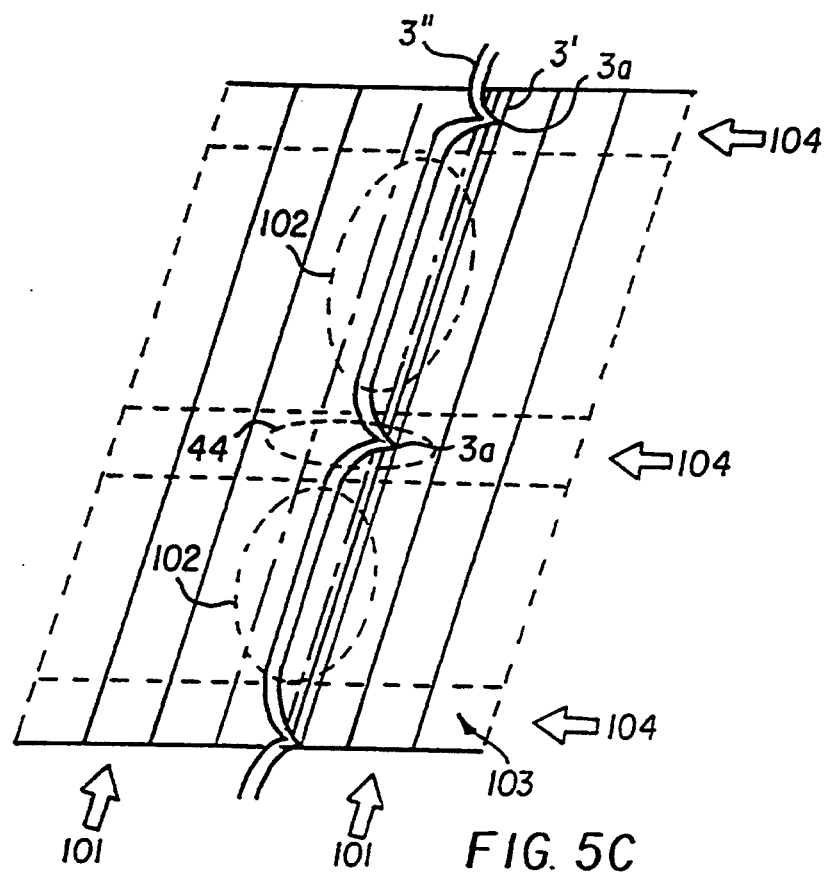
FIGS. 5A-5B are diagrams for illustrating the basic configuration of a first embodiment of a semiconductor memory apparatus according to the present invention.

FIG. 5C is a simple conceptual oblique view to illustrate how each word line 3 consists of an upper line 3″ which is formed of metal, and a lower line 3′ which is formed of polysilicon, and how these two lines 3″, 3′ are periodically interconnected by through-hole connections 3a within the back layer connecting regions 44.

In FIG. 5B, the designations 11a indicated respective ones of a plurality of power supply lines extending in a first direction which is shown in the drawing as the vertical direction, while the designations 11b indicate respective ones of a corresponding plurality of power supply lines each extending in a second direction that is shown in the drawing as the horizontal direction. The lines 11a and 11b are mutually insulated by being formed in respectively different layers. The lines 11a may for example be formed in an uppermost layer of the integrated circuit chip, while the lines 11b are formed in a layer that is disposed below that uppermost layer and electrically isolated from that uppermost layer and which also contains the transistor elements.

The sets of lines 11a, 11b are mutually electrically connected at their points of intersection by respective through-hole connections 31, to form an electrically conducting mesh 110 (which in this embodiment is in the shape of a rectangular grid). At least one end of each of the power supply lines 11a and 11b is connected to the $V_{SS}$ power supply voltage, which in this embodiment is at ground potential. The mesh 110 will be referred to in the following as the $V_{SS}$ supply mesh. The designations 12a indicate respective ones of a plurality of power supply lines each extending in the first direction, i.e. the vertical direction as viewed in FIG. 5B, which may be formed in the same upper layer of the integrated circuit chip as the lines 11a, while the designations 12b indicate respective ones of a corresponding plurality of horizontally extending power supply lines which are formed in the aforementioned lower layer, and so are electrically isolated from the lines 12a. The sets of lines 12a, 12b are mutually electrically connected at their points of intersection by respective through-hole connections 32, to form a second electrically conducting mesh 120. At least one end of each of the power supply lines 12a, 12b is connected to the $V_{DD}$ power Supply voltage, and the mesh 120 will be referred to in the following as the $V_{DD}$ supply mesh.

Figure 5D:
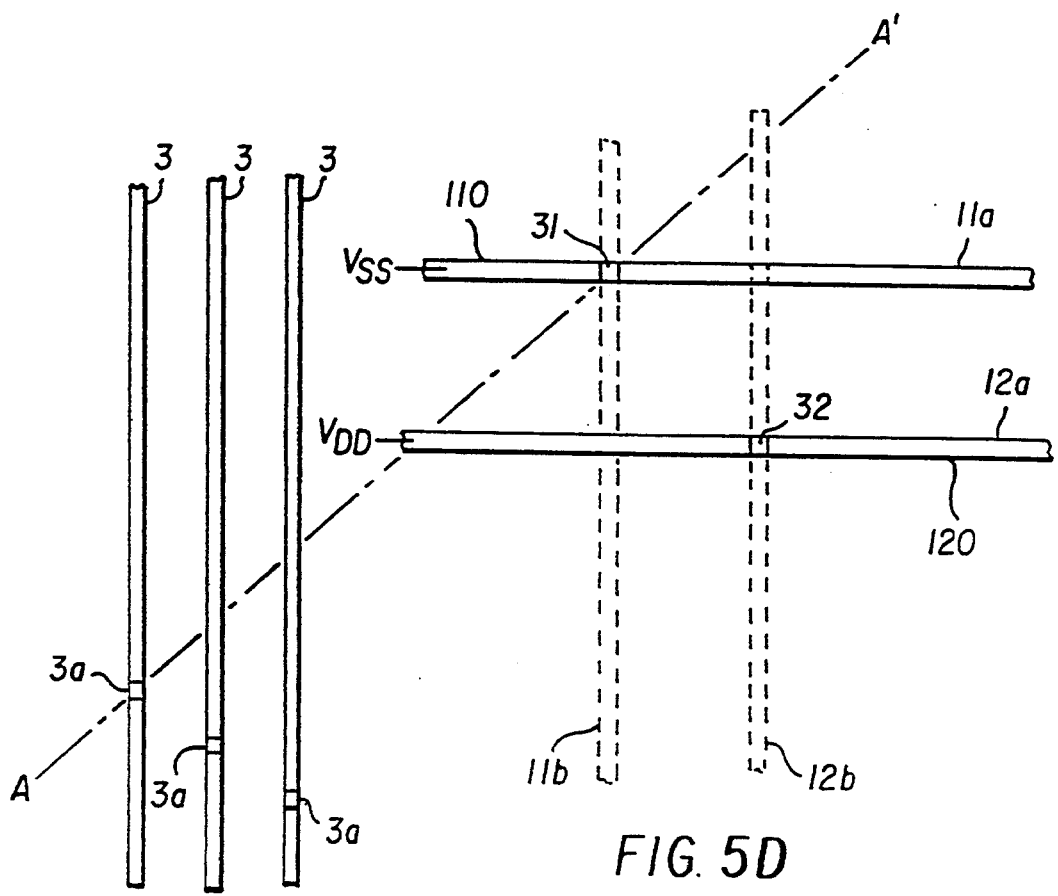
Figure 5E:
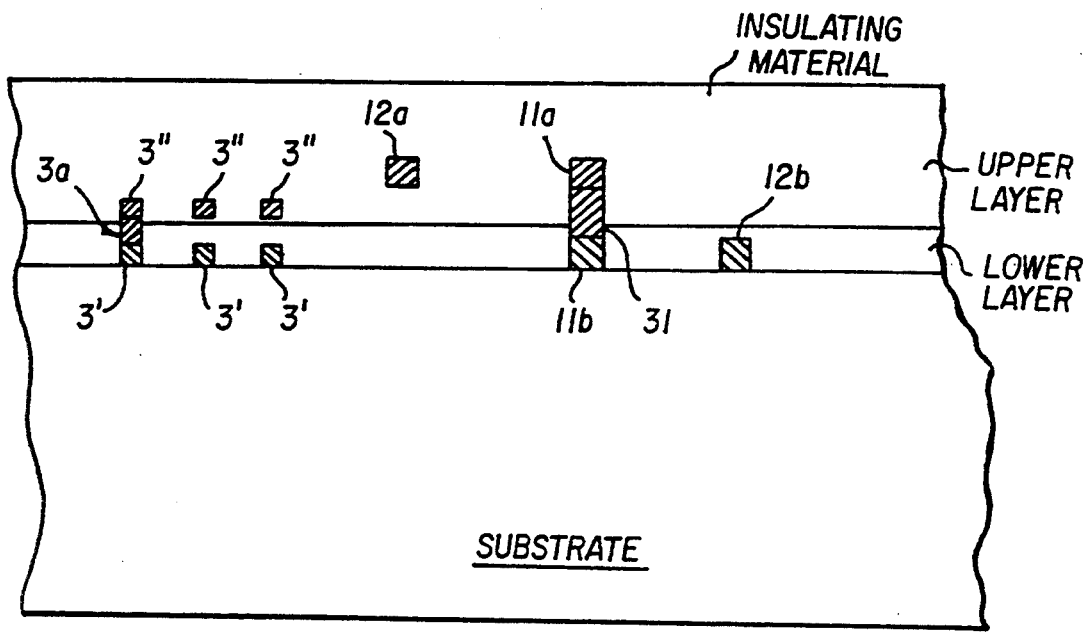
Figure 5F:
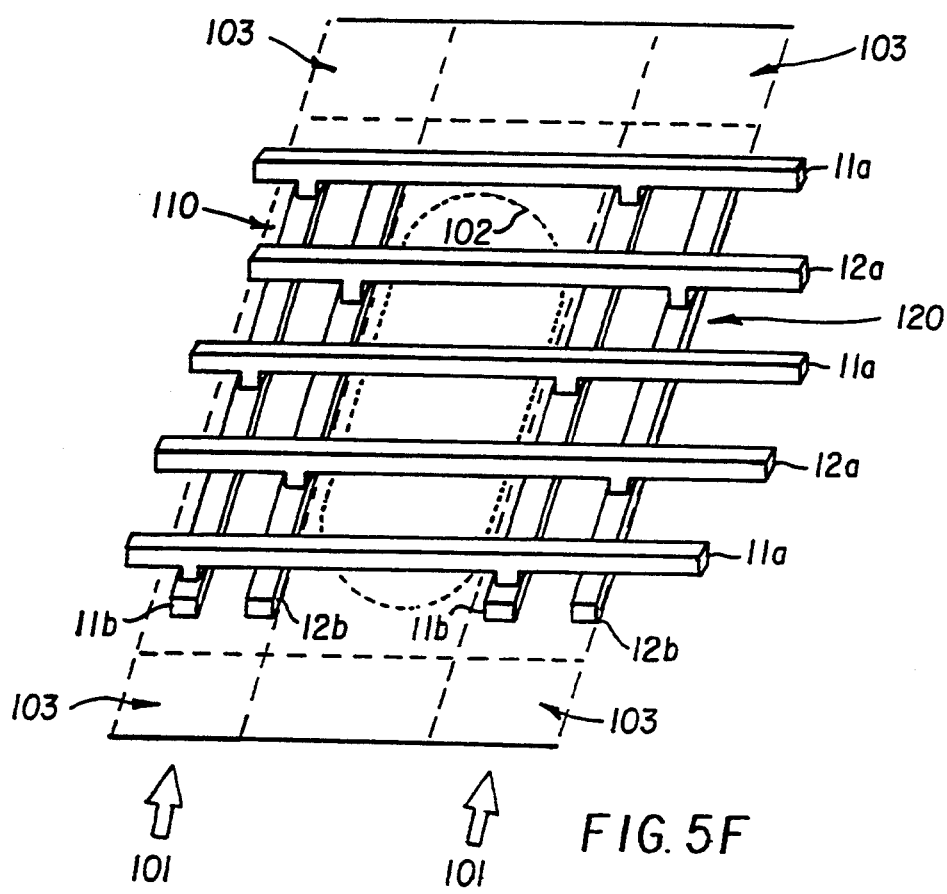

FIG. 5F is a conceptual oblique view to illustrate part of the power supply meshes 110, 120 as described hereinabove. For ease of understanding, the thickness of each line of the meshes has been greatly enlarged.

It can be understood that with this embodiment, the Vss supply mesh 110 and Vdd supply mesh 120 are dispersed throughout the regions 101 which contain columns of sense amplifier circuits, and also throughout the regions 104 in which are formed the back layer connecting regions and in which (in this embodiment) are also formed the sense amplifier drive circuits, in the intersection regions 103. Thus both the Vss supply mesh 110, Vdd supply mesh 120 and the sense amplifier drive circuits are dispersed throughout the memory area, so that each of the sense amplifier drive circuits (which are dispersed throughout the memory array region rather than located only at the periphery, as mentioned above) can be connected to the nearest points thereto on the Vss supply mesh 110 and Vdd supply mesh 120 to receive the $V_{SS}$ and $V_{DD}$ supply voltages respectively. Thus the lengths of the paths between each sense amplifier drive circuit and the Vss supply mesh 110 and Vdd supply mesh 120 can be minimized. Moreover the distances between the sense amplifier circuits and the sense amplifier drive circuits can also be made much shorter than has been possible in the prior art, thereby providing various advantages over a prior art type of DRAM, as described in detail hereinafter. In addition, each sense amplifier drive circuit drives a smaller number of sense amplifier circuits than is possible in a prior art semiconductor memory apparatus, in which sense amplifier drive circuits are not distributed throughout the memory cell array.

FIG. 5D is a simplified partial plan view to illustrate part of the word lines 3 and the power supply meshes 110, 121 of this embodiment. For ease of understanding, the spacings shown between the work lines and supply mesh conductors have been altered from those of a practical apparatus. The through-hole interconnections between the upper and lower lines 3″, 3′ of each word line 3 are each designated as 3a, while the through-hole interconnections between the lines 11a, 11b of the supply mesh 110 and between the lines 12a, 12b of the supply mesh 120 are respectively designated as 32 and 32.

FIG. 5E is a cross-sectional view in elevation corresponding to FIG. 5D, taken along the line A—A' of FIG. 5D. As illustrated, the lower lines 3′, 11b and 12b are each formed of suitably doped polysilicon, within a polysilicon layer formed on a substrate. Various other circuit elements such as transistors are also formed in that polysilicon layer. As shown, the upper lines 3″ and 11a, 12a of the word lines and supply meshes are formed as respective metal lines in an upper layer, above and insulated from the polysilicon lower layer in which the lower lines are formed.

Figure 6A:
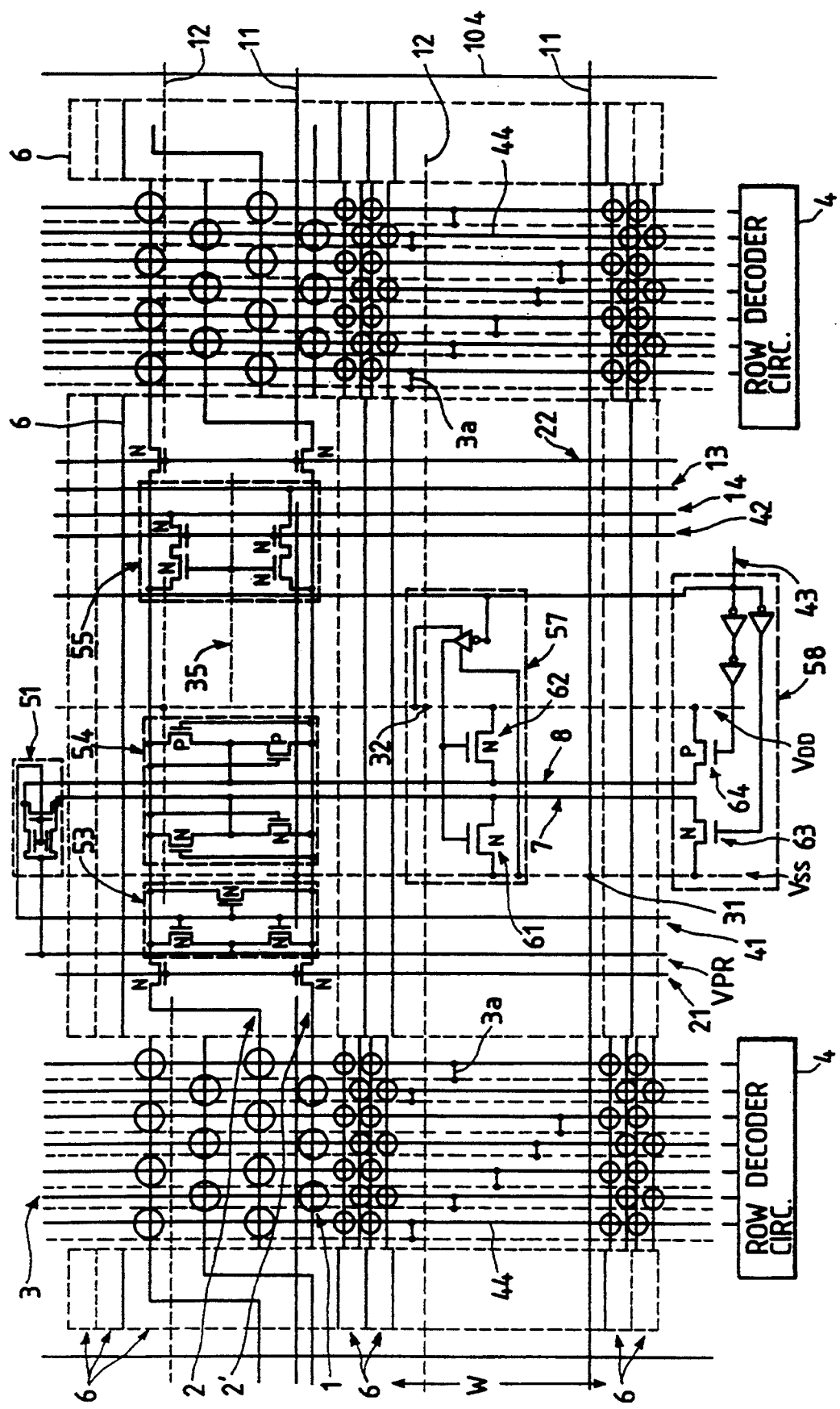
FIGS. 6A-6B is a diagram showing details of a portion of the circuit of the first embodiment.
Figure 6B:
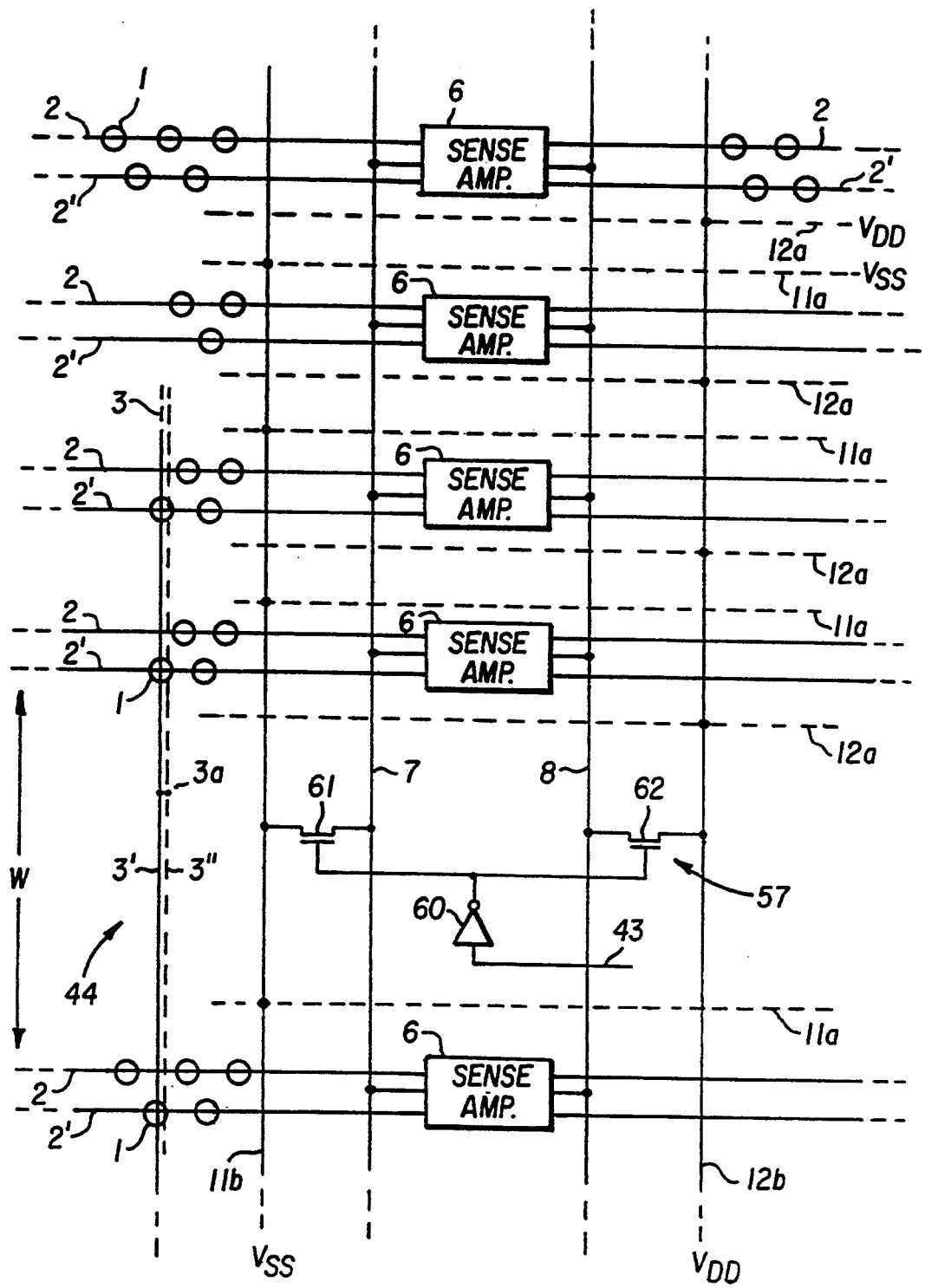

FIGS. 6A and 6B are respective partial circuit diagrams of the first embodiment. FIG. 6A shows the basic configuration whereby a sense amplifier drive circuit 57 (formed of FETs 61, 62 and inverter 60) is positioned within two vertically adjacent unit sense amplifier blocks. In FIG. 6A, the conductors 11a, 11b, 11a, 12b of the supply meshes, and lines which can be coupled to the supply meshes, are shown in heavy black lines, to distinguish these from normal signal lines. FIG. 6B shows more details of the circuit, including internal configuration of a sense amplifier circuit 6.

To avoid excessive complexity in the drawing, some of the connecting lines have been omitted or are shown only partially, while some of the dimensional relationships have been distorted for ease of understanding. The configuration of a region 104 will first be described in which a row of back layer connecting regions are formed and in which, in this embodiment, sense amplifier drive circuits are also formed. In FIG. 6A, 6B the reference numerals 6 designate respective sense amplifier circuits, each of which can be connected to a pair of bit lines 2, 2' coupled to memory cells 1 in a memory cell region to the right or to the left of that sense amplifier circuit. As shown, the sense amplifier circuits 6 are arranged in unit blocks within successive vertically extending columns, with these unit blocks positioned in correspondence with memory cell regions to either side, and with each unit block consisting for example of a total of 64 sense amplifier circuits. In FIG. 6B, one of the sense amplifier circuits 6 is shown in detail, expanded in size, while the contents of one of the regions 104 are also shown in detail, expanded in size to show a sense amplifier drive circuit 57 and the width W (indicated by arrows) of each region 44, FIG. 6B also shows row drive circuits 4, each of which drives a column of unit memory cell blocks shown, and a sense amplifier drive circuit 58 which serves to ensure satisfactory rewriting of memory cell contents after each read operation, as described in detail hereinafter, and which operates in conjunction with a column of dispersed sense amplifier drive circuits 57. Numeral 41 denotes a precharge control line, 42 denotes a sense amplifier column selector line and 43 a sense amplifier activation line. In addition, 51 denotes a sense amplifier control line precharge circuit, 53 denotes a precharge control circuit, 54 denotes a sense amplifier flip-flop circuit, formed of an n-channel FF and a p-channel FF as shown, and 55 denotes a data transfer circuit.

In the embodiment of FIG. 6, each of the regions 103 shown in FIGS. 5A, 5B has one of the sense amplifier drive circuit 57 formed therein. In a sense amplifier drive circuit 57, 61 and 62 denote n-channel MOS transistors for sense amplifier driving, which are connected to the sense amplifier n-channel FF drive line 7 and sense amplifier p-channel FF drive line 8 respectively. In the sense amplifier drive circuit 58, 63 denotes an n-channel MOS transistor for sense amplifier driving, which is connected to the sense amplifier n-channel FF drive line 7, while 64 denotes a p-channel MOS transistor for sense amplifier driving which is connected to the sense amplifier p-channel FF drive line 8.

Each of the word lines 3 is formed of an upper and a lower conductor, formed in an upper and a lower layer which are mutually electrically isolated. Each upper conductor of a word line 3 is connected to the corresponding lower conductor by means of a through-hole connection 3a, as indicated in FIG. 6. Sets of these through-hole connections 3a are formed in respective ones of the aforementioned regions 44, between the memory cell regions that are successively arranged in a vertical column, with each set of word lines 3 of such a column being driven by a corresponding row decoder circuit 4.

In the following, for brevity of description, the combination of the aforementioned bit line precharge circuit 53, CMOS FF amplifier circuit 54 and data transfer circuit 55, in conjunction with a pair of n-channel MOS transistors that are controlled by the shared switch gate control line 21 and a pair of n-channel MOS transistors that are controlled by the shared switch gate control line 22, will be referred to as a sense amplifier circuit, although actual amplification is executed by the CMOS FF amplifier circuit 54. A column of such sense amplifier circuits 6 is disposed between each pair of adjacent columns of memory cell regions, and sense amplifier drive circuits 57 are distributed throughout each column of sense amplifier circuits 6, i.e. with one sense amplifier drive circuit 57 being disposed in each of the regions 103 between two horizontally adjacent back layer connecting regions 44, as described above. Each sense amplifier drive circuit 57 is connected to the Vss supply mesh 110 and the Vdd supply mesh 120 at respective nearest points on these meshes to that circuit 57. Thus as can be understood from FIG. 6, the length of each connecting line between a sense amplifier drive circuit 57 and a power supply mesh can be made extremely short.

The operation of this embodiment will first be described for the case of data read-out from a memory cell 1. For simplicity, the description will be given with reference to the sense amplifier circuit 6 whose internal circuit is shown in detail in FIG. 6B, and the bit line pairs 2, 2' that are coupled to that sense amplifier circuit. Firstly, when the charge stored as a data value in a memory cell 1 is to be read out, the bit lines 2, 2' are each set to the precharge potential Vpr. The shared switch gate control lines 21 and 22 are each set to high level potential, so that each of the sense amplifier circuits 6 becomes connected to the memory cell regions that are positioned at the left and at the right of it. Next, the precharge control line 41 is set to the high level potential, so that the bit line precharge circuit 53 charges the bit lines 2, 2' both within the sense amplifier circuit 6 and within the memory cell regions that are located to the left and right of that sense amplifier circuit 6, to the precharge voltage Vpr. At the same time the sense amplifier control line precharge circuit 51, which is located at the upper end of the column of sense amplifier circuits 6, simultaneously charges the sense amplifier n-channel FF drive line 7 and sense amplifier p-channel FF drive line 8 to the precharge voltage Vpr. Next, the shared switch gate control line for the memory cell region that is not to be read out, for example the line 22 which controls read-out of data from the memory cells to the right of the sense amplifier circuit 6, is set to the low level potential, so that only the unit memory cell block from which read-out is to be effected remains connected to the sense amplifier circuit 6. One of the word lines 3 is then selected by the row decoder circuit 4, whereby that word line rises to the high level potential. As a result, the charge that is held in a corresponding one of the memory cells that is coupled to the bit line pair 2, 2' is transferred to one of these bit lines, causing a minute potential difference to be produced between these bit lines 2, 2'. That potential difference is then amplified by the sense amplifier circuit 6. That amplification begins after the sense amplifier activation line 43 is set to the low level potential, whereby each of the n-channel MOS transistors 61, 62 in the sense amplifier drive circuit 57 (and in all of the other sense amplifier drive circuits of that column of sense amplifier circuits, each sense amplifier drive circuit 57 being located between two horizontally adjacent ones of the back layer connecting regions 44 as described hereinabove) is set in the conducting state, so that the potential of the sense amplifier n-channel FF drive line 7 approaches the ground potential ($V_{SS}$), while the potential of the sense amplifier p-channel FF drive line 8 approaches the power supply potential $V_{DD}$. Latching operation of the flip-flops that are formed within the CMOS FF amplifier circuit 54 thereby occurs, providing amplification of the minute potential difference between the bit line pair 2, 2'.

The sense amplifier column selector line 42 is then set to the high level potential, and the column selector line 35 is then also set to the high level potential, whereby the signal state within the sense amplifier circuit 6 that results from the triggering of the flip-flops is transferred, via the data transfer circuit 55, to be outputted via the data lines 13 and 14. That signal is thereafter further amplified, and then outputted from the memory chip.

In parallel with the data read-out operation described above, an operation is effected for rewriting the read-out data back into the memory cell from which it was-read. This is executed by the sense amplifier drive circuit 58, which is disposed at the lower end of the column of sense amplifier circuits 6. When the sense amplifier activation line 43 is set to the low level potential, the n-channel MOS transistors 63, 64 within the sense amplifier drive circuit 58 are each set in the conducting state, whereby the sense amplifier n-channel FF drive line 7 is caused to approach the potential $V_{SS}$ even more closely than it is brought by the action of the various sense amplifier drive circuits 57 in that column of sense amplifier circuits 6, and the sense amplifier p-channel FF drive line 8 is similarly brought even closer to the $V_{DD}$ supply potential.

The above operations complete the read operation sequence executed by the sense amplifier circuit 6, with the data read out from the memory cell 1 having been outputted from the memory chip.

In the above embodiment, an n-channel MOS transistor 62 is used in each sense amplifier drive circuit 57 for driving the p-channel FFs of the sense amplifier circuits via the sense amplifier p-channel FF drive line 8. As a result, the potential of the sense amplifier p-channel FF drive line 8 will not rise completely to the $V_{DD}$ supply voltage during a read operation, but will differ from $V_{DD}$ by an amount that is equal to the threshold voltage of the MOS transistor 62. Thus, data rewriting back into a memory cell after a read operation cannot be effected in a completely satisfactory manner by the operation of these sense amplifier drive circuits 57 alone. However the reasons for using an n-channel MOS transistor in each sense amplifier drive circuit 57 are as follows. If a p-channel MOS transistor were to be used in place of the n-channel transistor 62 in each sense amplifier drive circuit 57, then it would also be necessary to use an additional pair of inverters within the sense amplifier drive circuit 57, if the sense amplifier column selector line 42 is directly connected to each sense amplifier drive circuit 57 as in FIG. 6. This would result in additional space being required in the width of each row 104 of back layer connecting regions 44, making the design rules even stricter. That problem could be overcome by connecting the sense amplifier activation line 43 through a single inverter (e.g. one of the inverters in the sense amplifier drive circuit 58) to all of the sense amplifier drive circuits 57, however in that case it would be necessary to use an inverter having a sufficiently high degree of current drive capacity for that purpose. Moreover it is advantageous to use an n-channel MOS transistor as the transistor 62 in each sense amplifier drive circuit 57, since in general, for a specific size of transistor (i.e. size of substrate area occupied), an n-channel MOS transistor has a greater current drive capability than a p-channel MOS transistor. Thus, savings in space are achieved by using n-channel MOS transistors.

Thus as described above, each sense amplifier drive circuit 57 functions primarily during the stage of data read-out, with the level of voltage to which the sense amplifier p-channel FF drive line 8 is driven during that stage by the sense amplifier drive circuits 57 being sufficiently high to ensure satisfactory amplification operation by the sense amplifier circuits 6. The purpose of the sense amplifier drive circuit 58, as mentioned hereinabove, is to ensure that the sense amplifier p-channel FF drive line 8 as well as the sense amplifier n-channel FF drive line 7 will then be driven to values that are sufficiently close to the $V_{DD}$ and $V_{SS}$ values respectively to ensure satisfactory rewriting of data back into the memory cells. For that reason, a p-channel MOS transistor is used in the sense amplifier drive circuit 58 for driving the sense amplifier p-channel FF drive lines, so that the problem that is encountered when an n-channel MOS transistor is used for such a drive function (i.e. caused by the transistor threshold voltage) does not arise.

The following results are achieved from a DRAM memory having the configuration described above. Firstly, the problem of sense amplification delay, resulting from the resistance values of the drive lines 7 and 8 as described hereinabove, can be substantially completely overcome. This is due to the fact that a plurality of sense amplifier drive circuits 57, for driving the sense amplifier circuits 6 during data read-out, are distributed throughout each column of sense amplifier circuits 6, along the sense amplifier circuit drive lines 7 and 8, so that the average distance between each sense amplifier circuit 6 and a sense amplifier drive circuit 57 (i.e. as measured along the direction of the sense amplifier drive lines 7 and 8) can be made from ⅛ to 1/32 times the distance in the case of a prior art DRAM. The amounts of effective line resistance of the drive lines 7 and 8 are thereby correspondingly reduced, and hence the desired reduction of the sense amplification delay time can be achieved. The present invention is the first DRAM memory apparatus to make such a result possible, which is made feasible by the provision of the Vss supply mesh 110 and Vdd supply mesh 120, since these enable the aforementioned distribution of the plurality of sense amplifier drive circuits 57 throughout each column of sense amplifier circuits 6, and ensure that each sense amplifier drive circuit 57 can provide a sufficiently high level of drive current.

As was done for the prior art example described hereinabove, the operation of a 64 Mbit DRAM in accordance with the above embodiment was simulated, using the SPICE circuit simulator. The relationship between the widths of the sense amplifier n-channel FF drive line 7 and sense amplifier p-channel FF drive line 8 and the sense amplification delay time $T_D$ was thereby obtained, designating the width of each sense amplifier n-channel FF drive line 7 as $W_{AL}$ and assuming that the width of each sense amplifier p-channel FF drive line 8 is equal to $W_{AL} \times 0.2$, and also assuming that these lines are formed of aluminum with a thickness of 0.8 m, as for the prior art example. The result is plotted as the curve Z2 in FIG. 4. As will be clear from that curve, the sense amplification delay time $T_D$ is approximately 4 ns, so that the delay time is reduced by at least 4 ns by comparison with the prior art example. Moreover, as the widths of the supply lines 7 and 8 are reduced, and even if these are made extremely narrow, there is almost no change in the sense amplification delay time. Thus by comparison with the prior art, the first embodiment of the present invention enables the sample delay time to be made extremely small, while in addition the widths of the supply lines 7 and 8 for driving the n-channel FFs and p-channel flip-flops respectively of the sense amplifier circuits can be made narrower than has been possible in the prior art, thereby enabling a higher degree of integration to be achieved than has been possible in the prior art, without the danger of an increase being produced in the sense amplification delay time $T_D$. The first embodiment therefore enables the objectives of both increased speed of operation and increased circuit scale, i.e. increased memory capacity, to be both realized.

Figure 7B:
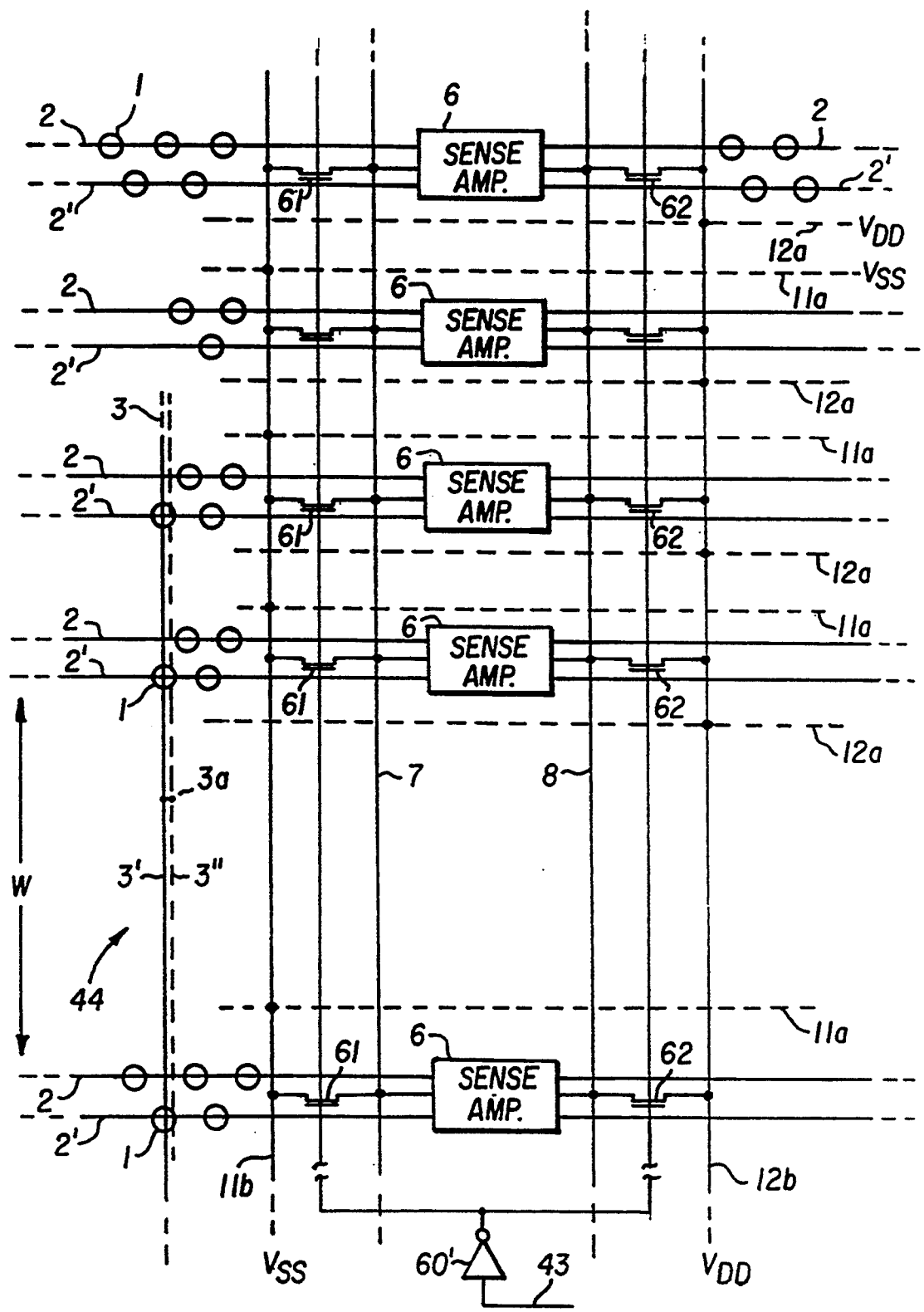

A second embodiment of the present invention will be described referring to FIGS. 7A and 7B. This embodiment differs from the first embodiment of FIG. 6 only in that the sense amplifier drive circuits 57 are removed from each row 104 of back layer connecting regions 44, to be replaced by sense amplifier drive circuits 57' each of which is contained within a region in which a sense amplifier circuit 6 is formed. In addition, each of these sense amplifier drive circuits 57' does not include an inverter, and instead, an inverted signal of the sense amplifier activation line 43 is supplied to these in common from the output of a first-stage inverter within the sense amplifier drive circuit 58, as shown. Thus by comparison with the first embodiment, this embodiment may enable the width of each row region 104 of back layer connecting regions 44 to be reduced, thereby enabling an even higher degree of integration. Otherwise, the results that are obtained by this embodiment are similar to those obtained for the first embodiment, as described above.

Figure 8:
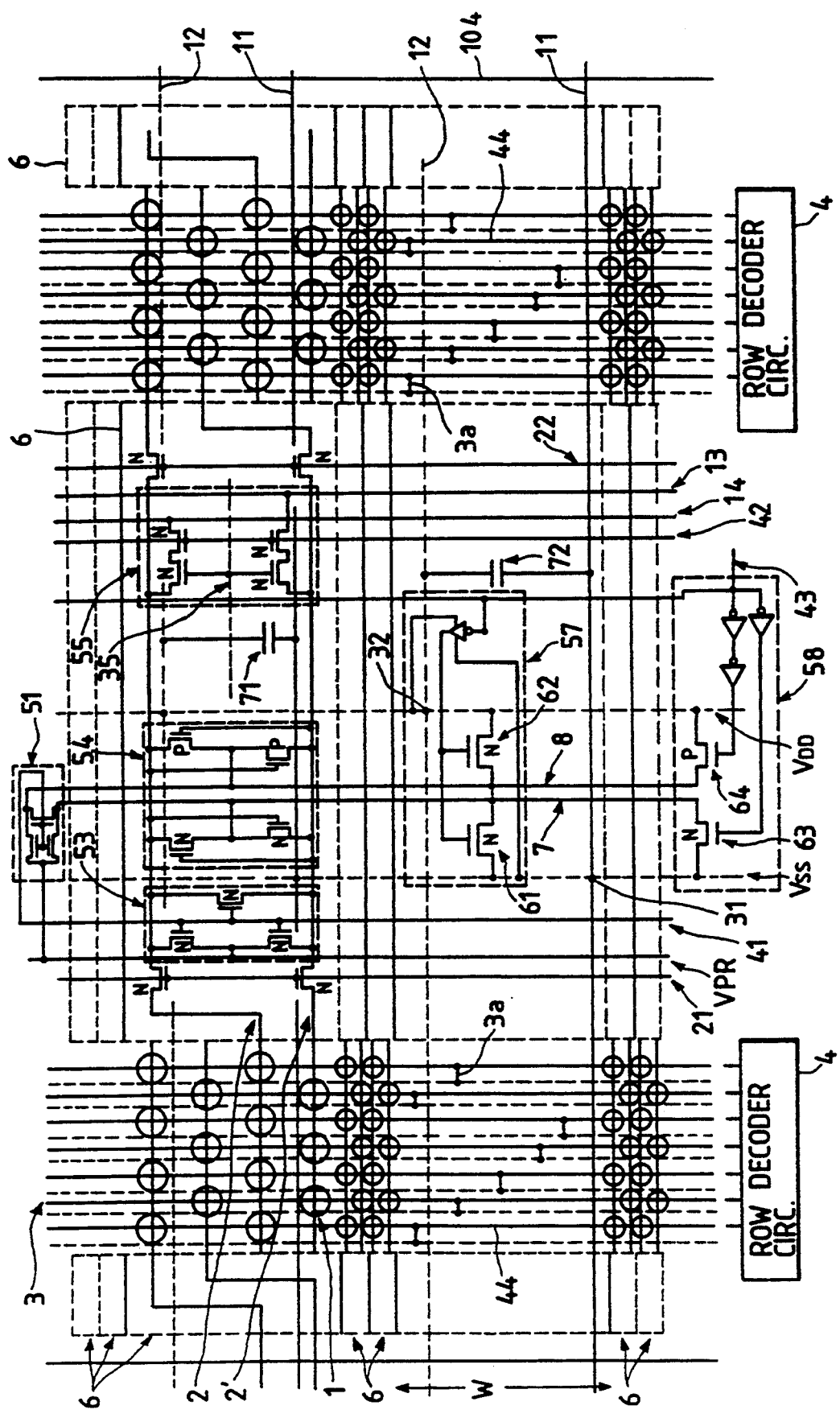

A third embodiment of the present invention will be described referring to FIG. 8. This embodiment differs from the first embodiment of FIG. 6 in that a stabilizing capacitor 71 is formed within each region in which a sense amplifier circuit 6 is formed, connected between the $V_{SS}$ and $V_{DD}$ supply potentials, more specifically, connected between two adjacent lines of the Vss supply mesh 110 and the Vdd supply mesh 120. In addition, a stabilizing capacitor 72 is connected between two adjacent lines of the Vss supply mesh 110 and Vdd supply mesh 120 within each row 104 of back layer connecting regions 44. These capacitors augment the naturally occurring stray capacitances between the Vss supply mesh 110 and Vdd supply mesh 120, and serve to prevent noise and crosstalk voltages from being conveyed by these power supply meshes, i.e. provide increased voltage stability for the Vss supply mesh 110 and Vdd supply mesh 120. Alternatively stated, for a given degree of voltage stability of the Vss supply mesh 110 and Vdd supply mesh 120, the line widths of these can be made narrower by incorporating the capacitors 71, 72, so that the overall area occupied by connecting lines can be reduced.

Moreover, the sum of the capacitances of these capacitors 71 and 72 will constitute a substantially large capacitance value in the overall memory chip, so that these are extremely effective in stabilizing the values of supply voltages $V_{DD}$ and $V_{SS}$ that are applied to peripheral circuits of the chip, and hence the overall operation of the semiconductor memory is further stabilized.

In the above, it is assumed that the capacitors 71, 72 are respectively provided within each sense amplifier circuit 6 region and also within each back layer connecting region region (between each pair of adjacent columns of memory cell regions). However it would be equally possible to provide such a capacitor only within each sense amplifier circuit 6 region, or to form the capacitors only within each row 104 of back layer connecting regions 44 (between each pair of adjacent regions 44).

Figure 9:
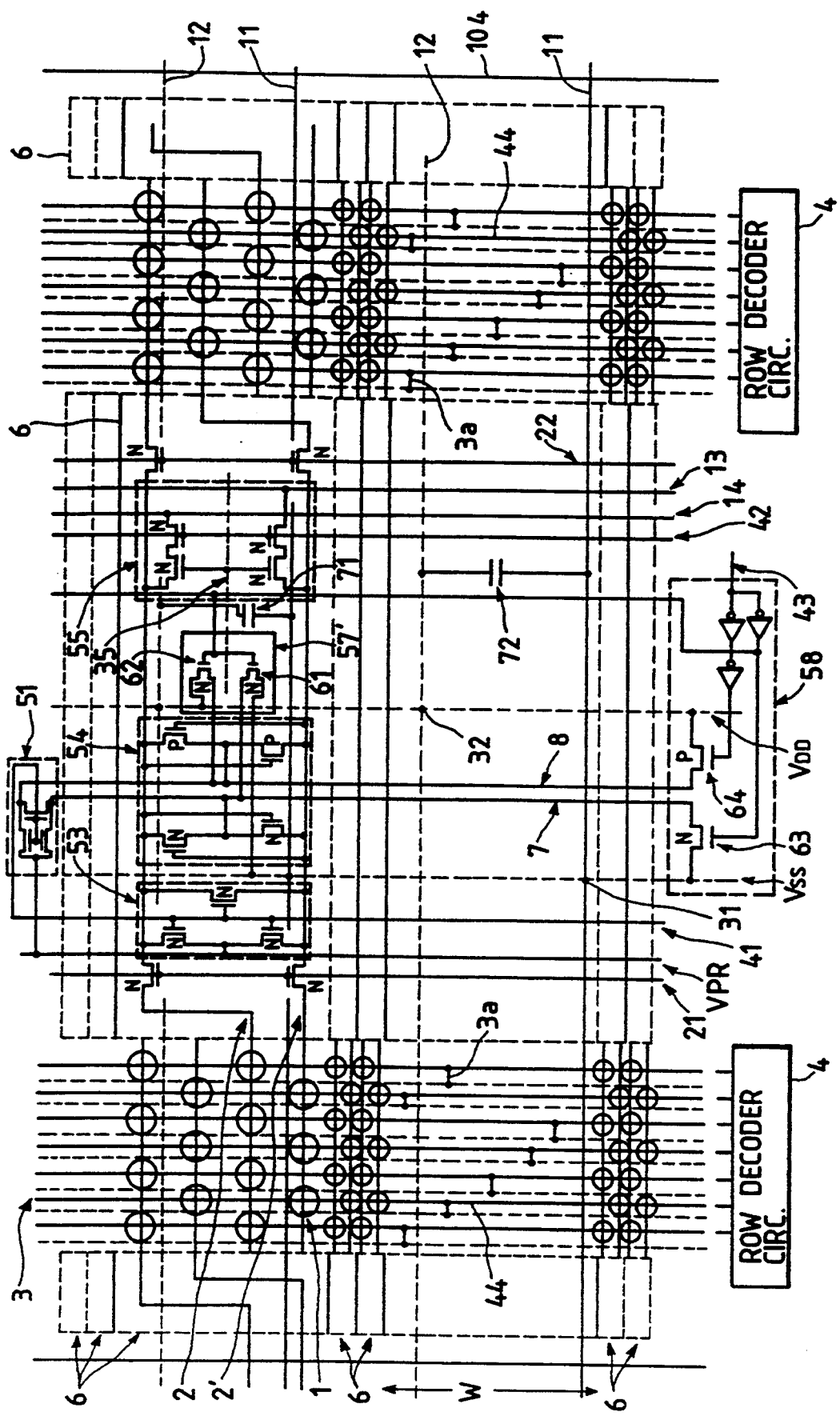

A fourth embodiment of the present invention will be described referring to FIG. 9. This differs from the second embodiment described hereinabove in that the stabilization capacitors 71, 72 of the third embodiment are further incorporated. The results obtained are similar to those obtained by the third embodiment.

Figure 10A:
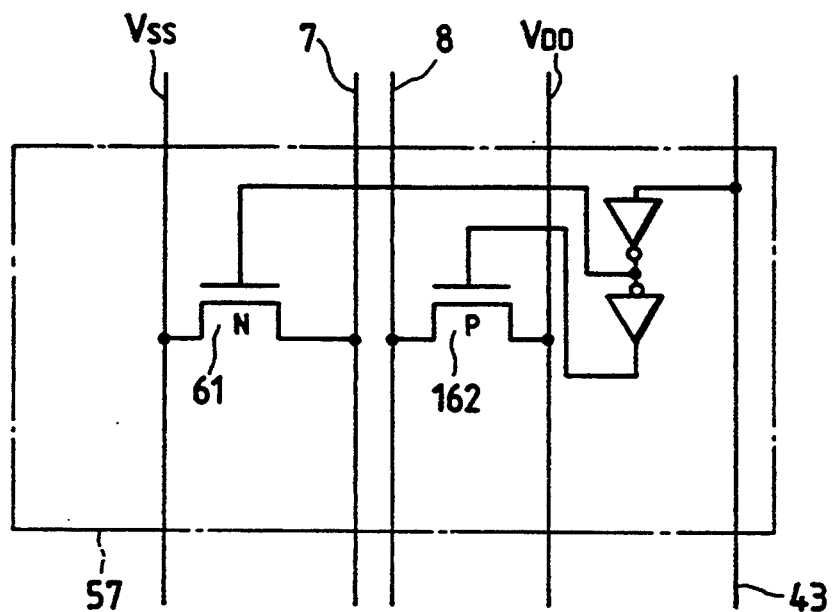
FIGS. 10A and 10B show alternative circuit configurations for a sense amplifier drive circuit 57 in the embodiments of FIGS. 6 and 9 respectively.
Figure 10B:
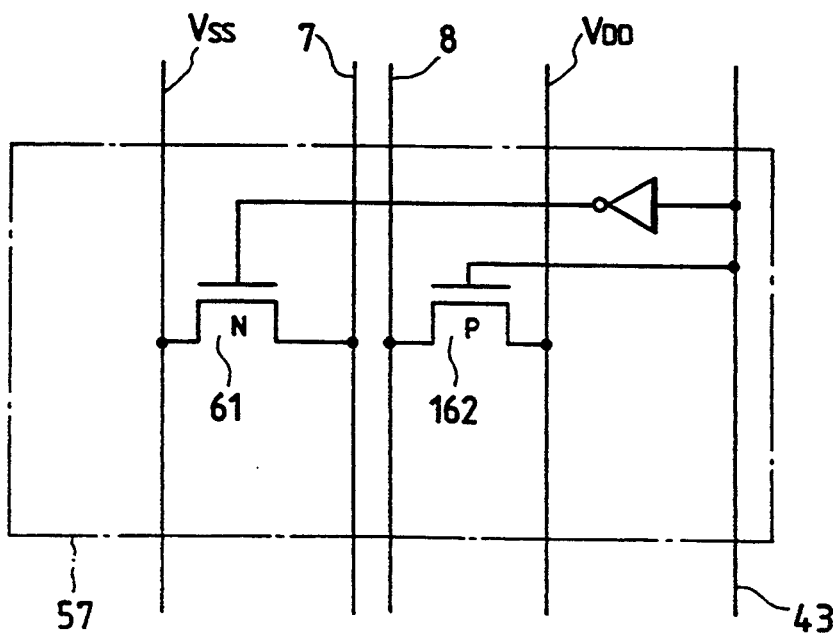

In each of the first through fourth embodiments of the present invention described above, an n-channel MOS transistor 62 is used in each sense amplifier drive circuit 57 as a sense amplifier drive transistor for driving the p-channel FFs of the sense amplifier circuits 6 via the sense amplifier p-channel FF drive line 8. However as mentioned hereinabove, it would be equally possible to use a p-channel MOS transistor for that purpose. FIG. 10A shows a first example of an alternative circuit for the sense amplifier drive circuit 57, in which a p-channel MOS transistor 162 is used in place of the p-channel MOS transistor 62, while also inserting an additional inverter 163 in each sense amplifier drive circuit 57, for driving the gate of the p-channel MOS transistor 162. FIG. 10B shows a second alternative configuration for the sense amplifier drive circuit 57. In this case, the gate of the p-channel MOS transistor 162 is driven directly from the sense amplifier activation line 43, which is connected in common to a column of sense amplifier drive circuits 57.

It can be understood from the above description that a semiconductor memory apparatus according to the present invention provides significant advantages over the prior art, with respect to enabling a higher degree of component integration to be achieved in order to produce a dynamic random access memory having increased storage capacity, which does not have an increased degree of read access time by comparison with prior art DRAMs having a lower storage capacity. That advantage is achieved by providing two voltage supply meshes which extend throughout a memory array region in which memory cells are formed, thereby enabling sense amplifier drive circuits (which drive the sense amplifier circuits of these memory cells) to be distributed throughout that region, by enabling each of the sense amplifier drive circuits to be directly coupled to receive supply voltages from immediately adjacent points on the respective meshes, i.e. ensuring in effect that each sense amplifier drive circuits is connected directly to a low-impedance drive voltage source, even if the sense amplifier drive circuit is located at a distance from the periphery of the memory array region.

What is claimed is:

1. A semiconductor memory apparatus including a memory array region having formed therein:
    a plurality of unit memory cell blocks distributed through said memory array region at regular spacings, each formed of an array of memory cells;

a plurality of unit sense amplifier blocks distributed among said unit memory cell blocks at regular spacings, each formed of an array of sense amplifier circuits;

a plurality of sense amplifier drive circuits for driving said sense amplifier circuits, distributed among said unit sense amplifier blocks at regular spacings; and first and second voltage supply meshes, mutually electrically isolated and each extending throughout said memory array region, respectively coupled to receive first and second supply voltages;

each of said sense amplifier drive circuits being coupled to an adjacent point on said first voltage supply mesh to receive said first supply voltage and to an adjacent point on said second voltage supply mesh to receive said second supply voltage.

2. A semiconductor memory apparatus according to claim 1, in which each of said said first and second voltage supply meshes is formed of a plurality of first supply lines extending in a first direction and formed in an upper layer of a substrate of said semiconductor memory apparatus and a plurality of second supply lines extending in a second direction and formed in a lower layer of said substrate which is electrically isolated from said upper layer, and a plurality of through-hole connections for interconnecting said first and second supply lines at points of intersection thereof.

3. A semiconductor memory apparatus according to claim 2, in which each of said first and second supply lines of said first voltage supply mesh is connected to said first supply voltage by at least one end thereof, and in which each of said first and second supply lines of said second voltage supply mesh is connected to said second supply voltage by at least one end thereof.

4. A semiconductor memory apparatus according to claim 1, in which each of said sense amplifier drive circuits is formed within a portion of said memory array region in which is formed one of said sense amplifier circuits.

5. A semiconductor memory apparatus according to claim 1, further comprising a plurality of voltage stabilizing capacitors each formed within a portion of said memory array region in which is formed one of said sense amplifier circuits.

6. A semiconductor memory apparatus according to claim 1, in which said plurality of unit memory cell blocks are configured as a plurality of columns of unit memory cell blocks each extending in a first direction, each column consisting of a plurality of said unit memory cell blocks disposed at regular spacings, and in which each of said memory cells is connected to one of a plurality of word lines which extend in said first direction, each of said word lines being formed of an upper conductor formed in an upper layer of a substrate of said semiconductor memory apparatus and a lower conductor formed in a lower layer of said substrate, said upper and lower conductors being interconnected by through-hole connections in each of a plurality of connection regions provided at intervals throughout each of said columns.

7. A semiconductor memory apparatus according to claim 6, in which each of said sense amplifier drive circuits is disposed in a region between two adjacent ones of said connection regions of two adjacent ones of said columns.

8. A semiconductor memory apparatus according to claim 6, further comprising a plurality of voltage stabilizing capacitors each connected between said first and second voltage supply meshes and disposed within a region between two adjacent ones of said connection regions of two adjacent ones of said columns.

9. A semiconductor memory apparatus according to claim 8, further comprising a plurality of voltage stabilizing capacitors each formed within a portion of said memory array region in which is formed one of said sense amplifier circuits.

* * * * *